(12) United States Patent
Shiu et al.

(10) Patent No.: US 7,652,892 B2
(45) Date of Patent: Jan. 26, 2010

(54) WATERPROOF USB DRIVES AND METHOD OF MAKING

(75) Inventors: George Shiu, Fountain Valley, CA (US); Wei Koh, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 0 days.

(21) Appl. No.: 11/367,824

(22) Filed: Mar. 3, 2006

(65) Prior Publication Data

US 2007/0206365 A1    Sep. 6, 2007

(51) Int. Cl.
*H05K 5/06* (2006.01)
(52) U.S. Cl. .................. 361/752; 361/730; 361/737; 174/521
(58) Field of Classification Search .......... 361/752, 361/730, 737; 174/521; 257/687
See application file for complete search history.

(56) References Cited

U.S. PATENT DOCUMENTS

| | | | | |
|---|---|---|---|---|
| 5,009,311 A | * | 4/1991 | Schenk .................. 206/706 |
| 5,114,006 A | * | 5/1992 | Wilk ..................... 206/349 |
| 5,244,840 A | * | 9/1993 | Kodai et al. ................ 29/841 |
| 5,293,002 A | * | 3/1994 | Grenet et al. ............. 174/541 |
| 5,319,522 A | * | 6/1994 | Mehta .................... 361/748 |
| 5,329,522 A | * | 7/1994 | Takagi .................... 370/280 |
| 5,392,197 A | * | 2/1995 | Cuntz et al. .............. 361/818 |
| 5,502,892 A | * | 4/1996 | Lien ....................... 29/841 |
| 5,617,297 A | * | 4/1997 | Lo et al. .................. 361/737 |
| 5,703,761 A | * | 12/1997 | Heiss ..................... 361/800 |
| 5,877,545 A | * | 3/1999 | Prince et al. .............. 257/679 |
| 6,222,122 B1 | * | 4/2001 | Davidson .................. 174/554 |
| 6,380,487 B1 | * | 4/2002 | Hollenbeck et al. ......... 174/135 |
| 6,665,192 B2 | * | 12/2003 | Wimberger et al. ......... 361/752 |
| 7,049,510 B2 | * | 5/2006 | Neuhaeuser ............... 174/521 |
| 7,095,615 B2 | * | 8/2006 | Nichols ................... 361/719 |
| 7,146,721 B2 | * | 12/2006 | Hunkeler et al. ............ 29/841 |
| 7,214,075 B2 | * | 5/2007 | He et al. .................. 439/135 |
| 7,249,978 B1 | * | 7/2007 | Ni ......................... 439/660 |
| 7,269,004 B1 | * | 9/2007 | Ni et al. ................. 361/679.41 |

OTHER PUBLICATIONS

Promotional art published on the internet RE: SanDisk waterproof USB Flash Drive.
Promotional art published on the internet RE: USB Waterproof Flash Drive—0840.
Promotional art published on the internet RE: USB Flash RAM 0512Mb A-Data.

* cited by examiner

*Primary Examiner*—Dameon E Levi
(74) *Attorney, Agent, or Firm*—Sawyer Law Group, P.C.

(57) ABSTRACT

A data storage device and methods of manufacture are provided which tend to protect the device against moisture and shock. The device includes a circuit board, a coating, a housing, and preferably a sealant. The circuit board is in electrical communication with an electrical interface. The coating is disposed at least on the circuit board to generally encapsulate the circuit board. The housing is sized and configured to generally encompass the circuit board and the coating. The housing includes a housing opening being sized and configured with the electrical interface being at least partially exposed therethrough. The sealant is preferably disposed within the housing substantially intermediate the interior surface of the housing and the coating on the circuit board. Further, at least one of the coating and the sealant may be disposed substantially intermediate the electrical interface and the housing opening.

22 Claims, 3 Drawing Sheets

WATERPROOF USB DRIVES AND METHOD OF MAKING

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present invention relates generally to data storage media, and more specifically, to a uniquely configured data storage device protected against moisture and shock through the use of a conformal coating and a sealant.

Within the past five years, digital data storage media such as USB drives and removable flash memory cards have been widely used and increasingly popular. These types of storage media allow a consumer quick and easy access to digital files such as photo, music, video, etc. Additionally, these storage media also allow the consumer to quickly and easily save these files onto a convenient and portable storage media, thus allowing the consumer access to the files at any variety of locations on any given computer. Convenience is indeed one of the most salient features of these storage media. However, one of the other salient features of the storage media—it's portability also contributes to some of the disadvantages associated with the storage media. For example, during transport, these storage media may often be damaged by moisture (such as water) and may frequently be damaged as a result of shock, which occurs when the storage media is dropped, jarred, or otherwise physically abused.

Figure 1:
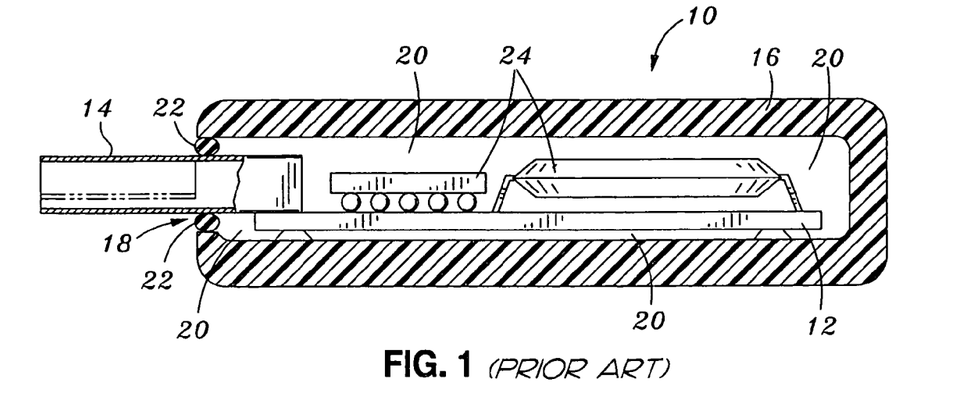
FIG. 1 is a side cross sectional view of a prior art USB flash drive including a housing, a circuit board, and an O-ring seal.

It is extremely important to protect these storage media from the above-mentioned dangers of transport, specifically moisture and shock damage, in order to protect the digital files stored thereon. These storage media should be protected from pressure, heat, other environmental factors, and other rigors of usage. Most conventional USB drives, as well as digital non-volatile flash memory cards such as secure digital (SD) or multi-media cards (MMC), are not fully waterproof. For example, as shown in FIG. 1, a prior art USB flash drive 10 is commonly constructed using an internal circuit board 12 that includes a connector 14 mounted thereon and a plastic housing 16 that surrounds the circuit board 12 and includes an opening 18 wherethrough the connector 14 is exposed. Typically, the housing 16 is either welded or glued to the connector 14 and circuit board 12. However, because there are air pockets 20 within the device, any gaps between the connector 14 and the housing 16 or at the seams of the housing 16 may allow moisture to seep in.

Several solutions have been devised in order to protect these devices against moisture damage. In some cases, the devices use bulky rubberized protection that includes a thick rubber or polymer external housing. In other cases, a metal housing is used. Frequently, the interface between the housing 16 and the connector 14 is sealed using an O-ring 22. These solutions are often effective in protecting the circuit board 12 disposed within the devices. Nevertheless, the housing 16 of such devices, be it made of rubber, polymer, or metal, and despite the use of the O-ring 22, often loses the tight seal between the opening 18 and the connector 14 as a result of handling and aging over time. Thus, the waterproof capability of the device 10, with or without the use of the O-ring 22, may either gradually or suddenly fail.

Additionally, solutions have been advanced to protect these devices against shock and various forms of impact. Typically, the solution includes encasing the device in a very thick, often rubberized housing. While somewhat effective, the thicker walls of the housing tend to enlarge the size of the device, thus making the device bulkier and unattractive to consumers who desire a discrete, compact storage media. Additionally, if the device is to remain the same size, the internal space available for the circuit board must be decreased, which may limit the size of the circuit board and therefore limit the storage capacity of the device.

In addition to the above-mentioned solutions, these devices have also been manufactured through injection molding. In such cases, the housing is created utilizing an injection molded plastic that is formed around the circuit board. This creates a tight seal around the circuit board which results in a substantially waterproof, albeit heavy, device. However, due to the intricate and delicate design of the circuit board, the circuit board may be damaged during the injection molding process. Furthermore, after the circuit board has been enveloped in the injection molded plastic, plastic material is integrated with the circuit board and its on-board components. Thus, not only does the injection molding frequently damage crystals, passives, and flash integrated circuit (IC) packages, injection molding also makes it very difficult to repair the devices because the plastic materials are extremely difficult to separate from the circuit board without affecting the delicate interconnection or joints between the circuit board and its various components. Thus, difficulty in repair is the main drawback for an injection molded USB drive or other memory cards.

Therefore, there is a need in the art for a data storage device that will remain robust over time to offer protection against moisture and shock during the life of the device itself. In this regard, there is a need for a data storage device that resists both normal and harsh handling and aging over time, as well as other mechanical abuses such as dropping, bending, and impact, etc. Furthermore, there is a need in the art to create a waterproof and shockproof data storage device without increasing the thickness of the housing of such a device, thus maximizing the internal space for circuit boards of various sizes and storage capabilities. Additionally, there is a need in the art for a waterproof and shockproof data storage device that may be disassembled for repair without substantially damaging the circuit board. Finally, there is a need in the art for a data storage device that is not only waterproof and shockproof, but that is lightweight and compact thus providing superior waterproof and shockproof qualities without becoming heavy or bulky.

BRIEF SUMMARY

In order to address many of the above-mentioned drawbacks associated with the prior art, a data storage device is provided that is protected against moisture and shock. The means taught herein may be used to protect any electronic device that is subject to the risk of moisture or shock damage, but are herein taught with particular regard for USB flash drives and related data storage devices. The means of protection include the use of a coating, a sealant, and a housing, which are described below.

According to an exemplary embodiment of the present invention, the device includes a circuit board that is in electrical communication with an electrical interface. The coating is disposed at least on the circuit board to provide a moisture resistance layer of protection. The coating may generally encapsulate the circuit board, and preferably is conformal to the circuit board. Additionally, the coating is preferably free of voids. The coating may be made various materials, and is preferably made of a moisture repellant polymer, a polymeric resin such as an epoxy or polyimide resin, for example.

Further, the housing is also used to provide additional protection against moisture and shock. The housing is sized and configured to generally encompass the circuit board and the coating. The housing of the device may be configured according to the size and shape of the internal circuit board, other components, and the electrical interface, as well as defining an interior surface. Furthermore, the housing includes a housing opening that is sized and configured to allow the electrical interface to be at least partially exposed therethrough. In addition, the housing is also preferably hermetically sealed.

The device may further include a sealant to provide yet another layer of protection. The sealant may be disposed within the housing substantially intermediate the interior surface of the housing and the coating on the circuit board. Preferably, at least one of the coating and the sealant is disposed substantially intermediate the electrical interface and the housing opening. The sealant may be made of various materials, but is preferably a thermoplastic foam sealant or an adhesive paste containing microporous polymer fillers. The sealant preferably substantially conforms to the interior surface of the housing. Finally, the sealant is preferably expandable foam; the sealant may also be preferably made of a shock-absorbing material.

According to yet another embodiment of the present invention, a method is provided of fabricating the data storage device to ensure that the device is protected against moisture and shock. The method comprises the steps of covering the circuit board with a coating; applying a sealant within the housing substantially intermediate the interior surface of the housing and the coating on the circuit board; and installing the circuit board within the housing with the electrical interface being exposed through the housing opening. In addition, the step of applying the sealant may be performed prior to installing the circuit board within the housing.

In another implementation of the method, the covering step may include dipping the circuit board into the coating. In this regard, the covering step may be performed utilizing one of spraying, brushing, and jet dispensing the coating onto the circuit board. The method may also include the step of curing the coating. Finally, the method may further include the step of hermetically sealing the device.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 2:
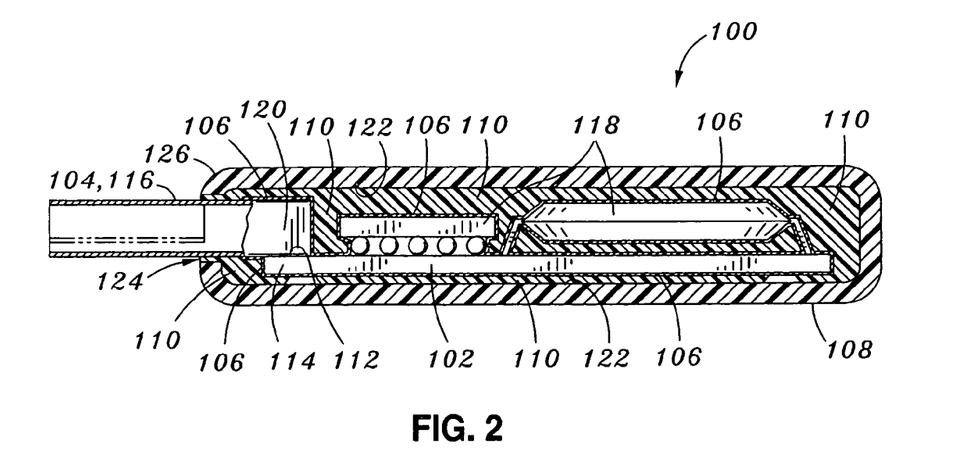
FIG. 2 is a side cross sectional view of a data storage device including the circuit board, electrical interface, coating, housing, and sealant in accordance with an embodiment of the present invention.

Referring now to the drawing wherein the showing is for purposes of illustrating a preferred embodiment of the invention only, and not for purposes of limiting the same, FIG. 2 is a side cross sectional view of a data storage device 100 that incorporates innovative means of protection against moisture (such as water) and shock, in accordance with an exemplary embodiment of the present invention. Although FIG. 2 shows an exemplary embodiment of the data storage device 100 as being a USB flash drive, it should be understood that the data storage device 100 may be any electronic device that is subject to the risk of moisture or shock damage. Other examples of such diverse devices may include memory cards, wristwatches, devices incorporating LCD readouts such as the Apple IPOD (a registered trademark of Apple Computer, Inc.), cell phones, remote controls, and key fobs, to name a few. As such, embodiments of the present invention may be beneficially used in relation to any variety of devices that incorporate delicate internal elements that need protection against moisture and shock.

Referring to the exemplary embodiment shown in FIG. 2, the data storage device includes a circuit board 102, an electrical interface 104, a coating 106, a housing 108, and a sealant 110. The device 100 may be configured to include any number of circuit boards 102 or electrical interfaces 104, as desired. One of the unique features of embodiments of the present invention is that the coating 106, sealant 110, and/or housing 108 may be used to provide multiple layers of protection against moisture and shock, and in a preferred embodiment, provide waterproof and shockproof protection of the data storage device 100. Thus, several redundant means may be used to provide resistance to moisture and shock—even after extensive usage over time, aging, and abusive handling—thus allowing the device 100 to maintain the ability to be protected against moisture and shock. In this regard, embodiments of the present invention make use of at least one chemically robust material, such as the coating 106, housing 108, and/or sealant 110, in order to prevent damage to the device 100 in any variety of rough and unfriendly physical environments. The device 100 may therefore go through washing cycles of a washing machine, a clothes dryer with prolonged heating, and survive in wet environments such as a cup of hot tea, hot coffee, cold juice, cold soft drinks, rain puddles, mud, lakes, ponds, water sinks, toilets, rivers, and oceans, to name a few. While it is contemplated that a preferred embodiment of the device 100 includes the coating 106, the housing 108, and the sealant 110, it is contemplated that other various embodiments may be made without all of these elements, such as described below.

It will be noted by comparing FIGS. 1 and 2, that embodiments of the present invention may be formed to include many of the same structural and electrical components 118 as those known in the art. The circuit board 102 of the device may thus include hardware as known in the art, as well as any improvements that may occur over time. For example, the circuit board 102 may be formed to include a contacts section 112 that is disposed at a distal end 114 of the circuit board 102. The electrical interface 104 is in electrical communication with the circuit board 102. The electrical interface 104 may include any variety of elements, such as monitors, transmitters, connectors, plugs, and/or sockets, to name a few. The electrical interface 104 may further be defined as any element that provides a link between two devices, or that interfaces between a user and the device. Thus, the electrical interface 104 may be a connector 118 of the USB-compatible data storage device 100, as shown in FIG. 2, a monitor or screen of a watch, an I/O port, or others. Referring again to FIG. 2, the connector 118 is in electrical communication with the contacts section 112 of the circuit board 102 and may even be mounted at the distal end 114 of the circuit board 102. Thus, the device 100 may send and receive data and store or delete data from the circuit board 102, as desired. The use of such components thus facilitates the transmission, storage, and deletion of data. It will be appreciated by one of skill in the art that the components used in the device 100 may be modified according to new discoveries, techniques, and/or new hardware that may be utilized. It should also be understood that embodiments of the present invention may focus on providing a method and structure that tends to ensure that the device 100 is waterproof and shockproof, and do not focus on a particular configuration of components or a configuration of the device 100. Thus, embodiments of the present invention may be utilized with virtually any media device to protect the same against damage from moisture and shock.

Referring again to FIG. 2, in order to provide a first layer of protection, the coating 106 is disposed at least on the circuit board 102. The coating 106 may provide seamless protection to the circuit board 102 and any components 118 disposed thereon, such as a printed circuit board subassembly that is typically assembled using surface mount technology or chip-on-board processes. In a preferred embodiment, the coating 106 generally encapsulates the circuit board 102. The coating 106 should preferably be applied to cover any components 118 on the circuit board 102 that require protection against moisture and shock. It is contemplated that in the manufacturing process, the coverage of the coating 106 may be more or less than on and around the circuit board 102; and such shall be understood as the coating 106 generally covering the circuit board 102 and other components 118, including at least a portion of the electrical interface 104, depending on the type of electrical interface 104 used. Indeed, the coverage of the coating 106 depends on the configuration of the circuit board 102, components 118, and electrical interface(s) 104 that are mounted thereon or connected thereto.

In the embodiment shown in FIG. 2, it may be preferable that the coating 106 cover the entirety of the exposed circuit board 102, as well as an end portion 120 of the connector 118 where it interfaces with the contacts section 112 of the circuit board 102. By allowing the coating 106 to generally encapsulate the circuit board 102 in this manner, the coating 106 may thus completely surround and cover any exposed portions of the circuit board 102. Additionally, as discussed below, the coating 106 is preferably conformal to the circuit board 102. For example, if the coating 106 is applied as a liquid (and later solidified), the coating 106 may thus be conformal and fill gaps to allow little, if any, separation between the coating 106 itself and the circuit board 102 and other coated components 118. Any internal air gaps, cavities, or empty spaces that remain may be problematic and result in moisture accumulation. Therefore, the coating 106 should preferably fill out all air gaps cover the circuit board 102 and components as completely as possible. Thus, although the coating 106 need not be conformal to the circuit board 102 and components 118, it is preferable to eliminate any air gaps that may otherwise be present. Finally, in order to ensure protection of the circuit board 102 and its components 118, the coating 106 should preferably be free of voids, such as pinholes.

In addition, the coating 106 may also be a moisture-repellant surface coating, and more preferably is made of a material that is waterproof. It is contemplated that the coating 106 may be made of a plastic, such as a polymeric resin, in the form of a viscous liquid, foam, or film. The coating 106 material may be, for example, a polymeric resin such as an epoxy, polyimide resin, or other appropriate material that is suitable for covering the circuit board 102 and/or internal components 118 of the device 100. The coating 106 should preferably be made of a material that may be removed from the circuit board 102 and/or components 118 without affecting the delicate interconnection or joints between the circuit board 102 and its various components 118 if repairs must be made to the circuit board 102 and/or components 118. It is contemplated that such materials may be known in the art and that such a choice may be performed by one of skill in the art depending on the type of device and type of internal components that are to be protected by the coating 106.

The application of the coating 106, when in liquid or foam form, may be performed by means of atomized spraying, dipping, vacuum coating, brushing, jet dispensing, and other means known in the art. When in solid form, the coating 106 may be applied through processes such as thermoforming, vacuum forming, shrink wrapping, and other processes known in the art. It is also contemplated that the coating 106 may include both liquid and solid forms, such as two distinct substances, that ultimately solidify and form the coating 106. Further, as in vacuum forming or shrink wrapping, the coating 106 may be applied as a solid and transition toward the liquid state in order to be adjusted to fit on the circuit board 102 and components 118. The teachings provided herein are exemplary, and other various methods and techniques as known in the art may be implemented to apply the coating 106. Preferably, a method of application will be utilized that ensures that the coating 106 has a pinhole-free finish and is wrapped tightly over the circuit board 102, preferably being conformal to the circuit board 102 and any components 118. Upon application of the coating 106 to the circuit board 102, the coating 106 may need to be cured in some instances. After application of the coating 106 and curing, if necessary, a level of protection to the device 100 is thus created.

In order to create another level of protection for the device 100, the sealant 110 may be used. In a preferred embodiment, the sealant 110 is used in addition to the coating 106, but it is also contemplated that the sealant 110 may be used without the coating 106, and vise versa. As illustrated in FIG. 2, the sealant 110 may be disposed within the housing 108. Although the housing 108 may be of any configuration with respect to size and shape, the housing 108 defines an interior surface 122. According to a preferred embodiment of the present invention, the sealant 110 is disposed within the housing 108 substantially intermediate the interior surface 122 of the housing 108 and the coating 106. Ideally, no air pockets should be left within the housing 108 and the sealant 110 should occupy all of the air gaps between the interior surface 122 of the housing 108 and the coating 106. If the sealant 110 is used without the coating 106, the sealant 110 should preferably occupy all of the air gaps between the interior surface 122 of the housing 108 and the circuit board 102 and any components 118. In either embodiment, any air gaps, cavities, or empty spaces that remain within the housing 108 may be problematic and result in moisture accumulation. Therefore, whether the sealant 110 is used with or without the coating 106, the sealant 110 should preferably fill out all air gaps within the housing 108.

Figure 3:
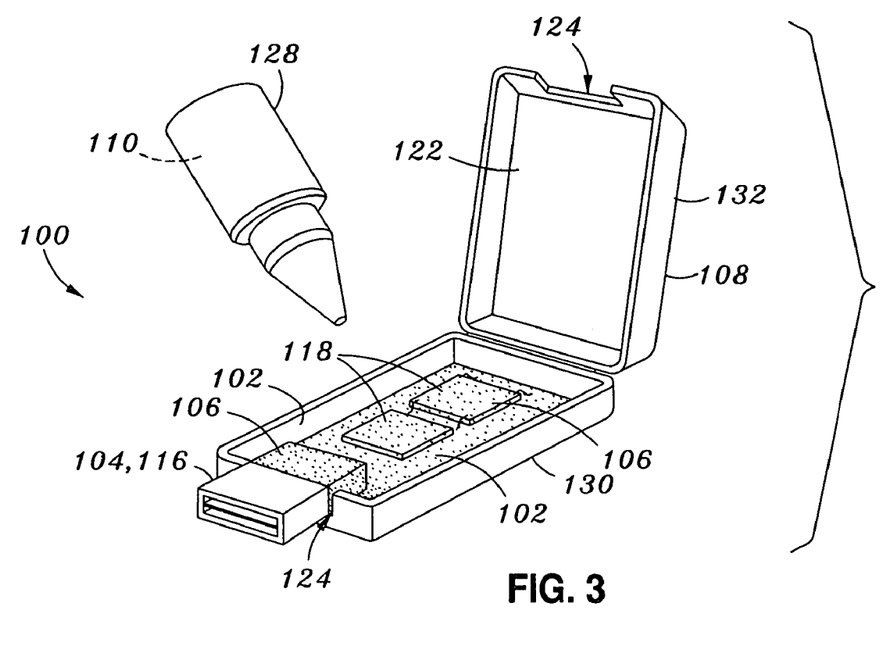
FIG. 3 is a perspective view of the data storage device wherein the housing includes upper and lower halves being operative to fold together along a width of the device in accordance with another embodiment of the present invention.
Figure 4:
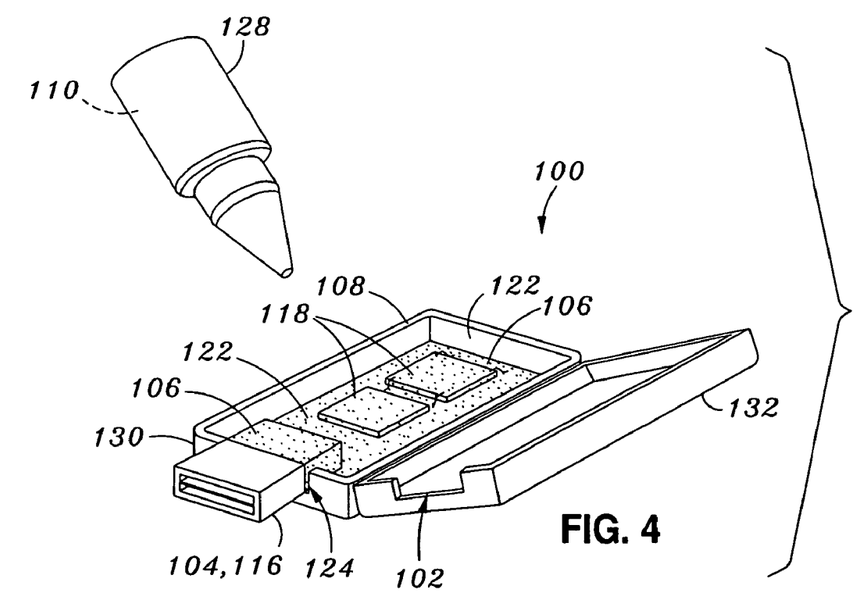
FIG. 4 is a perspective view of the data storage device wherein the housing includes upper and lower halves being operative to fold together along a length of the device in accordance with another embodiment of the present invention.
Figure 5:
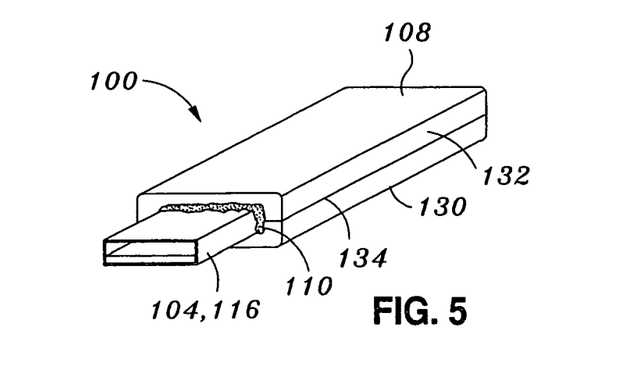
FIG. 5 is a perspective view of the data storage device wherein the upper and lower halves of the housing are in a closed position with according to yet another embodiment of the present invention.

The sealant 110 may be made of a thermoplastic foam or an adhesive paste that contains microporous polymer fillers. The sealant 110 may be applied to preferably be disposed within the housing 108 substantially intermediate the interior surface 122 of the housing 108 and the coating 106 on the circuit board 102. When applied, the sealant 110 is preferably applied to and around the coating 106 and/or circuit board 102 and components 118 prior to installation within the housing 108. As illustrated in FIGS. 3 and 4, the housing 108 may be configured to easily allow the circuit board 102 to be installed therein. In such a case, the circuit board 102 and the coating 106 may be covered in the sealant 110, installed, and then the housing 108 may be closed. Another method of applying the sealant 110, which is described below, includes placing the sealant in the housing 108 prior to installation of the circuit board 102. However, it is also contemplated that the circuit board 102 may be installed within the housing 108 prior to application of the sealant 110. In such a case, the sealant 110 may be injected into the housing 108, preferably through the housing opening 124 (but also perhaps through a hole in the housing 108 opposite the housing opening 124 so that the sealant 110 flows through the interior of the housing 108 toward the housing opening 124, thus tending to push all of the air inside of the housing 108 out through the housing opening 124), to fill the air gaps remaining in the housing 108 after installation of the circuit board 102 and/or other internal components 118. In either case, it is contemplated that an appropriate quantity of sealant 110 may be placed to within the housing 108 so as to fill all internal gaps and prevent the formation of air pockets within the housing 108. The sealant 110 may made of a material that expands to fill the internal gaps of the device 100 intermediate the interior surface 122 and the circuit board 102 or coating 106. As shown in FIG. 5, the sealant 110 may be applied with a sealant dispenser 128 to preferably flow around the entire housing opening 124 to provide a seal, thus eliminating the need for an O-ring, as discussed above. Flow of the sealant 110 around the housing opening 124 may be achieved through use of an expanding material, as mentioned, or by manually covering the entire inside of the housing 108 and the housing opening 124 with sufficient amounts of sealant 110.

The elimination of air pockets within the housing 108 is one of the unique advantages of embodiments of the present invention. Therefore, even if any moisture were to penetrate the housing 108, the moisture would be unable to remain within the housing 108 because there are preferably no air gaps within the housing 108. Additionally, as discussed further herein, the sealant 110 may also expand to fill the space intermediate the housing opening 124 and a periphery of the electrical interface 104, as shown in FIG. 2.

Furthermore, it is contemplated that the sealant 110 may be selected to provide an adhesive bond between the interior surface 122 of the housing 108 and the coating 106 disposed on the circuit board 102 (or the circuit board 102 and components 118 themselves if the coating 106 is not used). In this regard, as detailed below, the housing 108 may be formed of several individual pieces and may be attached to and around the circuit board 102, being adhered thereto by virtue of the adhesive quality of the sealant 110. In such an embodiment, the modular nature of the housing 108 may facilitate the insertion of the circuit board 102 to within the housing 108.

Figure 6:
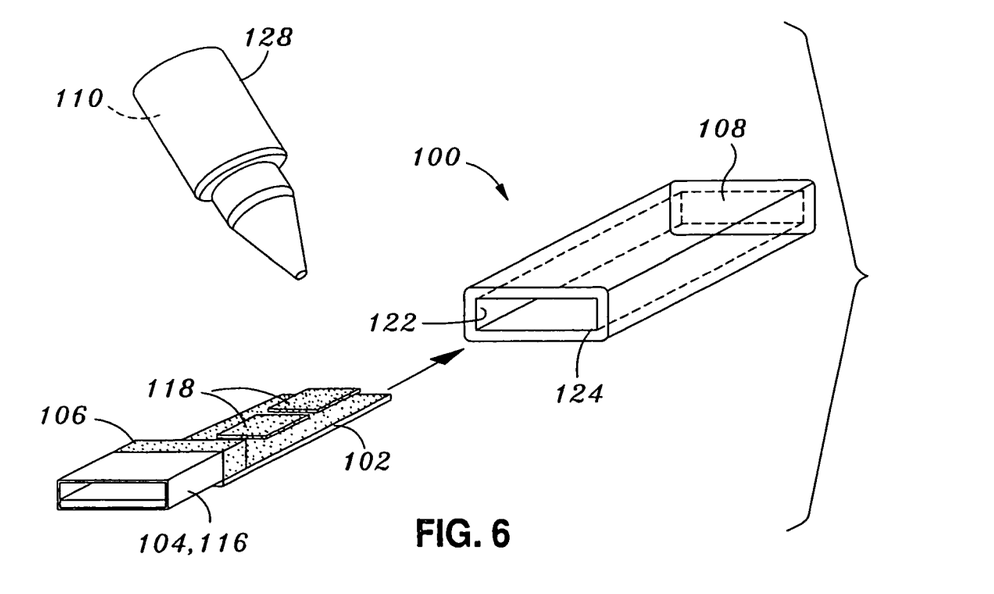
FIG. 6 is a perspective view of the data storage device wherein the housing is of unitary construction.

The device 100 may be fabricated using a modular housing 108; however, as shown in FIG. 6, it is also contemplated that the housing 108 may be of a single continuous material or of unitary construction, and that the circuit board 102 may be inserted therein along with the sealant 110. For example, the circuit board 102 may be inserted into the housing 108 first, followed by the sealant 110. As also taught further below, the In such cases, the sealant 110 is preferably applied in order to be disposed intermediate the electrical interface 104, such as the connector 118 and the housing opening 124. In such cases, the sealant 110 is preferably injected into the housing 108 to fill the void intermediate the interior surface 122 of the housing and the circuit board 102, as well as intermediate the electrical interface 104, such as the connector 118, and the housing opening 124. In this regard, the sealant 110 may be injected into the housing 108 prior to or after insertion of the circuit board 102. Such method may ensure that no internal air gaps are left within the housing 108 after the device 100 is assembled. Further, as discussed below, the sealant 110 may expand and tend to create a seal between the housing opening 124 and the circuit board 102 and/or electrical interface 104 (depending on the configuration of the device 100).

The sealant 110 is preferably a paste, foam, or viscous liquid coating that is solvent or water-based. The sealant 110 may contain microporous powder filler such as Orgasol ultrafine polyamide powder. The sealant 110 is preferably a made of a microporous material in order to ensure that the sealant 110 is a low density material. The use of a low density sealant 110 provides the device 100 with several advantageous moisture and shock resistant qualities while only adding a negligible amount of weight to the overall weight of the device 100. Additionally, the sealant 110 is preferably made of a shock-absorbing material in order to enhance the shock-proof qualities of the device 100. Furthermore, it is preferred that the sealant 110 have the qualities of a microporous structure that is compliant and able to conform to the surface of the coating 106 disposed on the circuit board 102 as well as to conform to the interior surface 122 of the housing 108. Such quality of conformance preferably forms intimate contact to the housing 108 so as to eliminate any air pockets, as described previously. Additionally, if applied directly to the circuit board 102 and/or components 118, the sealant 110 should preferably be made of a material that may be removed from the circuit board 102 without affecting the delicate interconnection or joints between the circuit board 102 and its various components 118 if repairs need to be made to the circuit board 102 and/or components 118. Finally, the sealant 110 may be made of a material that is curable by heat to form a strong bond between the internal surface 122 of the housing 108 and the circuit board 102 and components 118 or the coating 106, if used.

Furthermore, it is contemplated that as shown in FIG. 2, the housing 108 of the device 100 may be configured to include at least one housing opening 124. As mentioned above, the housing 108 may be modular (see FIGS. 3-5) or unitary (see FIG. 6) in construction. The housing opening(s) 124 may be of any size or shape depending on the requirements of the electrical interface(s) 104, which may include such diverse elements as monitors, transmitters, connectors, plugs, sockets, any element that provides a link between two devices, or any other element that interfaces between a user and the device, as described above. The housing 108 may be sized and configured to generally encompass the circuit board 102, components 118, and/or the coating 106.

In addition, the housing opening(s) 124 may be sized and configured with the electrical interface(s) 104 being at least partially exposed therethrough. In some instances, as illustrated in FIG. 2, the electrical interface 104 (shown as the connector 116) may be disposed through the housing opening 124. In such cases, the sealant 110 is preferably applied in order to be disposed intermediate the electrical interface 104, such as the connector 118, and the housing opening 124. Once applied, the sealant 110 may be flush with an external surface 126 of the housing 108; however, the sealant 110 may also protrude from beyond the housing opening 124. The sealant 110 may be smoothed around the housing opening 124 to ensure complete and thorough coverage of the housing opening 124, which may tend to mitigate against any moisture penetration to the interior of the housing 108.

The use of the sealant 110 is an advantageous feature of exemplary embodiments which allows for simpler fabrication of the device 100. In particular, by using the sealant 110 as taught herein, there is no need for the O-ring 22, shown in FIG. 1, to be disposed intermediate the connector 14 and the housing opening 18. As shown in FIG. 1, the O-ring 22 is typically inserted in order to prevent any moisture from entering the housing 16 of the USB flash drive 10. In this regard, because the sealant 110, when cured, may form a continuous filler material for the device 100, it is unlikely that the sealant 110 may be displaced from between the connector 116 and the housing opening 124. Thus, although the O-ring 22 found in various prior art devices may have been jarred loose from intermediate the connector 14 and the housing opening 18 due to typical physical abuse of the USB flash drive 10, it is contemplated that the sealant 110 used in embodiments of the present invention will eliminate this problem and provide a sturdy and reliable seal between the connector 116 and the housing opening 124. Although specific explanation has been made with respect to the embodiment shown in FIG. 2, it should be noted that other sealing elements utilized with other types of electrical interfaces 104 may also be eliminated to produce similar advantages given the teachings herein. Thus, embodiments of the present invention may eliminate elements previously needed in the manufacture of prior art devices, thereby enabling part manufacture that is cheaper and faster, as well as a higher quality part.

Referring exclusively now to FIG. 2, yet another layer of protection is the housing 108 itself. As mentioned above, the housing 108 is preferably sized and configured to generally encompass the circuit board 102 and the coating 106. As shown in the exemplary embodiment of FIG. 2, it is contemplated that the housing 108 will encompass the entire circuit board 102, any internal components 118 and the coating 106, if disposed on the circuit board 102. As mentioned above, the housing 108 may be comprised of a plurality of individual pieces (see FIGS. 3-5) or the housing 108 may be of unitary construction (see FIG. 6).

FIGS. 3 and 4 illustrate various embodiments of the housing 108 wherein the housing 108 is made of two halves. As shown in FIG. 3, the housing 108 may be folded along a width of the device 100. In FIG. 4, the housing 108 may be folded along a length of the device 100. Thus, in assembling the device 100, the sealant 110 may be placed inside a lower half 130 of the housing 108, the circuit board 102 may be installed into the lower half 130 of the housing 108, additional sealant 110 may be placed around and on top of the circuit board 102, and an upper half 132 of the housing 108 may then be folded down onto the lower half 130 to close the housing 108, thereby forming a seam 134 (as shown in FIG. 5) between the two halves 130, 132. Referring now to FIG. 5, if the sealant 110 is adhesive in nature, as mentioned above, the two halves 130, 132 of the housing 108 may be held in place by virtue of the adhesion provided by the sealant 110. However, other adhesives may also be applied to the seam 134 between the two halves 130, 132 in order to secure the housing 108 in a closed position. Further, the housing 108 may also be preferably hermetically sealed along the seam 134, as mentioned infra, to ensure that the housing 108 is airtight and watertight.

One of the innovative aspects of embodiments of the present invention is that because the device 100 may include the coating 106 and/or the sealant 110 for protection, the housing 108 may not need to have heavy or thick walls to protect against shock and moisture. Instead, it is contemplated that the coating 106 and/or sealant 110 may provide ample protection against moisture and shock. A normal thin-walled, impact resistant plastic may be used for the housing 108, and may be structurally supported by the rigid internal structure provided by the coating 106 and/or the sealant 110, which preferably have no macroscopic voids. Therefore, even for a think-walled housing 108, the housing 108 may be very structurally sound and sturdy. This will allow the device 100 to enjoy superior moisture and shock resistance qualities while keeping the weight of the device 100 low.

The housing 108 may be fabricated of various materials. In particular, it is preferred that the housing 108 be fabricated from a material that has high impact resistance and waterproof properties, such as PC/ABS resin materials. As shown in FIG. 6, the housing 108 may be a single unitary piece that receives the circuit board 102 with the coating 106, as well as the sealant 110; however, it is contemplated that the housing 108 may also be comprised of a plurality of individual pieces that are assembled together around the circuit board 102, as also mentioned above. In such a case, the interfaces between the housing 108 parts may be welded together or may be secured due to the adhesive property of the sealant 110, which may act as a binder to bond the parts together. Alternatively, the housing 108 may also be made of a metallic case with either one single integral part or a plurality of parts that are assembled together in like manner as described above. Furthermore, the device 100 may be assembled by inserting the circuit board 102, the coating 106, and the sealant 110 to within the housing 108. Additionally, the housing 108 may be constructed around the circuit board 102, coating 106, and sealant 110 in a piece wise construction. However, it is also contemplated that the housing 108 may be formed about the circuit board 102 and the sealant 110 and/or the coating 106. For example, the housing 108 may be applied to the device 100 in a liquid form and thereafter cured.

As described, the device 100 may be fabricated utilizing various combinations of configurations of the circuit board 102, various types of coatings and application methods, various types of sealants and application methods, and various types of housings and application methods. As will be appreciated, such the teachings herein allow for the fabrication of a data storage device that has superior waterproof and shockproof qualities. For example, even in the harshest of uses, and even if the housing 108 were to crack, any moisture that may otherwise seep through the crack, will be unable to reach the circuit board 102 due to the internal filler layer of the sealant 110 and/or the coating 106 that is disposed on the circuit board 102. Multiple layers of protection thus provide superior protection against moisture and shock compared to prior art devices. Furthermore, the chemical stability of the sealant 110 allows the device to be resistant to corrosion or natural electrolysis due to salt-water electrolyte. Thus, even though moisture may get past the housing 108, it is unlikely to get past or cause corrosion or destruction of the sealant 110. Nevertheless, in such a case that moisture reaches near the circuit board 102, the coating 106 may be disposed on the circuit board 102 to prevent the moisture from damaging the circuit board 102 and its components 118.

As described above, due to the intricate and delicate design of the circuit board 102, the circuit board 102 should not be damaged during the manufacturing process. In contrast to prior art injection molding processes, which envelop the circuit board 12 in injection molded plastic, thereby integrating plastic material with the circuit board 12 and its on-board components, embodiments of the present invention envelop the circuit board 102 and any components 118 in the coating 106 and/or sealant 110, which may be more easily removed than injection molded plastic in order to repair the device 100. Thus, embodiments of the present invention tend to ensure that no damage occurs to the crystals, passives, and flash integrated circuit packages of the circuit board 102, even when the coating 106 and/or the sealant 110 must be removed to access the circuit board 102 and/or components 118 for repair.

Finally, it is also contemplated that embodiments of the present invention shown in FIG. 2, may include a more robust connector 118 than utilized in the prior art. For example, referring to FIG. 1 as an example, most of the connectors 14 of prior art USB-compatible devices included a case that was made of a metal such as cold roll steel plated with nickel. Further, the connector 14 typically included a metallic contact area that would be plated in gold in order to reduce the electrical contact resistance of the contact area. These materials typically were sufficient to pass a salt spray test with 5 percent sale electrolyte solution exposed for 48 hours at up to 35° C. Further, the prior art design for a cap placed over the connector 14 also intended to create a waterproof seal between the USB housing 16 and the cap itself. The cap would therefore provide further protection to the connector 14 from corrosion and prevent any moisture from penetrating through the opening 18 of the housing 16. However, the cap may easily lose its waterproof seal with the housing 16 and therefore no longer be able to provide a waterproof seal. In addition, the cap may be lost thus eliminating any protection for the connector 14 itself and thus leaves the connector 14 entirely exposed and subject to gradual corrosion and degradation in humid and salty conditions.

In contrast, in accordance with embodiments of the present invention, the connector 118 may be more robust in design by using corrosion-resistant stainless steel metal instead of cold roll steel for the case of the connector 118. The case may still be finished in nickel and the contact area may also still include the gold plating for reducing the contact resistance. However, the change in the material of the case of the connector 118 will allow the device to be entirely corrosion resistant. Furthermore, in contrast to the prior art devices, embodiments of the present invention will not require the use of a cap in order to protect the connector 118 nor to provide a tight waterproof seal between the housing 16 and the cap. Embodiments of the present invention allow for the creation of a device that is robust and may withstand not only the elements, but also the rigors of day to day use, including unfortunate and unexpected moments where waterproofing and shockproof qualities are required.

In addition, it is contemplated that after the housing 108, sealant 110, and conformal coating 106 have been applied and the device 100 is assembled, that the entire device 100 is preferably hermetically sealed with no internal air gaps. The hermetic sealing, as discussed above, is preferably applied to the seal 134 of the housing 108, if applicable. Proving the hermetic seal will tend to ensure that the device 100 is mechanically robust while being moisture resistant and waterproof. Thus, whether the housing 108 includes the seam 134 or whether the housing 108 is seamless, the housing 108 may be hermetically sealed to provide protection against moisture.

The above description is given by way of example, and not limitation. Given the above disclosure, one skilled in the art could devise variations that are within the scope and spirit of the invention disclosed herein, including various ways of manufacturing and protecting various electrical devices against moisture and shock. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A data storage device protected against moisture and shock, the device comprising:
   an electrical interface defining opposing end portions, the electrical interface being electrically and mechanically connectable to an external electrical device;
   a circuit board being in electrical communication with the electrical interface;
   a fluid tight coating being disposed on the circuit board and at least one of the opposing end portions of the electrical interface;
   a housing having a housing interior, the housing interior being sized and configured to generally encompass the circuit board and the coating, the housing defining an interior surface and including a housing opening, the housing opening being sized and configured with the electrical interface being at least partially exposed therethrough; and
   an expandable fluid tight sealant being disposed within the housing interior substantially intermediate the interior surface of the housing and the coating on the circuit board and expandable to vent air out of the housing interior through the housing opening to remove air gaps within the housing interior, and provide a fluid tight seal within the housing interior, the sealant further being disposed about the electrical interface to provide a fluid tight seal between the electrical interface and the housing opening, and the sealant also provides adhesion between the circuit board and the housing.

2. The device of claim 1 wherein the fluid tight coating generally encapsulates the circuit board.

3. The device of claim 1 wherein the fluid tight coating is conformal to the circuit board.

4. The device of claim 1 wherein the fluid tight coating is free of voids.

5. The device of claim 1 wherein the fluid tight coating is a polymeric resin.

6. The device of claim 1 wherein the fluid tight coating is a polyimide resin.

7. The device of claim 1 wherein the fluid tight sealant is expandable foam.

8. The device of claim 1 wherein the fluid tight sealant is a thermoplastic foam sealant.

9. The device of claim 1 wherein the fluid tight sealant is adhesive paste containing microporous polymer fillers.

10. The device of claim 1 wherein the fluid tight sealant substantially conforms to the interior surface of the housing.

11. The device of claim 1 wherein the housing includes upper and lower halves being cooperatively engageable to form the housing and create a seam therebetween, the seam between the upper and lower halves of the housing being hermetically sealed.

12. A data storage device protected against moisture and shock, the device comprising:
- an electrical interface being electrically and mechanically connectable to an external electronic device;
- a circuit board being in electrical communication with the electrical interface and having a fluid tight coating disposed thereon;
- a housing being sized and configured to generally encompass the circuit board, the housing defining an interior surface and including a housing opening, the housing opening being sized and configured with the electrical interface being at least partially exposed there through, the housing includes upper and lower halves being cooperatively engageable to form the housing and create a seam therebetween, the seam between the upper and lower halves of the housing being hermetically sealed and an expandable fluid tight sealant being disposed within the housing substantially intermediate the interior surface of the housing and the circuit board coating and substantially intermediate the electrical interface and the housing opening, and the sealant also provides adhesion between the circuit board and the housing.

13. The device of claim 1 wherein the electrical interface is a USB connector.

14. The device of claim 1 wherein the electrical interface is electrically and mechanically connectable to a USB compatible external electrical device.

15. The device of claim 1 wherein the electrical interface is abuttingly connectable with the external electrical device.

16. The device of claim 1 wherein the circuit board is configured to store data.

17. A data storage device comprising:
- a housing having a housing interior, the housing defining an interior surface and a housing opening;
- a circuit board disposed within the housing interior and having a fluid tight coating disposed thereon;
- an electrical interface in electrical communication with the circuit board, the electrical interface being electrically and mechanically connectable to an external electronic device, the electrical interface being at least partially disposed within the housing opening;
- a fluid tight protective layer disposed at least on the circuit board and about the electrical interface to provide a fluid tight seal between the housing opening and the electrical interface; and
- an expandable fluid tight sealant disposed within the housing interior substantially intermediate the interior surface of the housing and the coating on the circuit board and expandable to vent air out of the housing interior through the housing opening to remove air gaps within the housing interior and provide a fluid tight seal within the housing interior, the sealant further being disposed about the electrical interface to provide a fluid tight seal between the electrical interface and the housing opening, and the sealant also provides adhesion between the circuit board and the housing.

18. The data storage device of claim 17 wherein the fluid tight protective layer is disposed within the housing substantially intermediate the interior surface of the housing and the circuit board.

19. The data storage device of claim 17 wherein the fluid tight coating generally encapsulates the circuit board.

20. The data storage device of claim 1 wherein the coating being operative to activate at room temperature.

21. The data storage device of claim 1, wherein the sealant being disposed within the housing interior and expandable to provide a fluid tight seal that stabilizes that electrical interface within the housing opening.

22. The device of claim 11 wherein the upper half is pivotable relative to the lower half between a closed position and an open position, the housing to receive the expandable fluid tight sealant when the upper half is disposed in the open position.

* * * * *